United States Patent
Nancekievill et al.

(10) Patent No.: US 7,404,155 B1
(45) Date of Patent: Jul. 22, 2008

(54) MERGING MULTIPLEXERS TO REDUCE ROM AREA

(75) Inventors: Dominic J. Nancekievill, West Wycombe (GB); Paul J. Metzgen, London (GB)

(73) Assignee: Altera Corporation, San Jose, CA (US)

( * ) Notice: Subject to any disclaimer, the term of this patent is extended or adjusted under 35 U.S.C. 154(b) by 285 days.

(21) Appl. No.: 11/265,605

(22) Filed: Nov. 1, 2005
(Under 37 CFR 1.47)

Related U.S. Application Data (60) Provisional application No. 60/685,226, filed on May 27, 2005.

(51) Int. Cl.
*G06F 17/50* (2006.01)

(52) U.S. Cl. .................... 716/2; 716/1; 716/3
(58) Field of Classification Search ............. 716/1–18
See application file for complete search history.

(56) References Cited

U.S. PATENT DOCUMENTS 6,292,930 B1 * 9/2001 Agrawal et al. ............ 716/16
6,759,869 B1 * 7/2004 Young et al. ............... 326/41

OTHER PUBLICATIONS

Raje et al., Generalized resource sharing, 1997, ACM/IEEE, pp. 326-332.*

Mukherjee et al., Minimal Area Merged of Finite State Machine Controllers, 1992, ACM/IEEE, pp. 278-283.*

Bergamaschi et al., Data-path synthesis using path analysis, 1991, ACM/IEEE, pp. 591-596.*

Metzgen et al., Multiplexer Restructuring for FPGA Implementation Cost Reducion, ACM, Jun. 13-17, 2005, pp. 421-426.*

Lakshminarayana et al., Synthesis of Power-Optimized and Area-Optimized Circuit from Hierarchical Behavioral Descriptions, DAC/ACM, Jun. 15-19, 1998, pp. 15-19, 1998.*

* cited by examiner

*Primary Examiner*—Jack Chiang
*Assistant Examiner*—Nghia M Doan
(74) *Attorney, Agent, or Firm*—Ropes & Gray LLP; Jeffrey H. Ingerman (57) ABSTRACT

Systems and method for reducing the die area occupied by a programmable logic device are provided. The systems and methods relate to a programmable logic device comprising a plurality of multiplexers. A portion of the multiplexers form a multiplexer cone. The cone is characterized in that all but one of the multiplexers in the cone has an output which only feeds data inputs of other multiplexers in the cone. Methods according to the invention preferably include identifying two multiplexers in the cone. The two multiplexers are selected based on the fact that the two multiplexers receive substantially identical data inputs and are not used by the programmable logic device to provide outputs during a single clock cycle. Finally, systems and methods according to the invention merge the functions of the two multiplexers into a single merged multiplexer.

10 Claims, 9 Drawing Sheets

MERGING MULTIPLEXERS TO REDUCE ROM AREA

CROSS-REFERENCE TO RELATED APPLICATION

This application claims the benefit under Title 35, United States Code, § 119(e), of U.S. Provisional Application No. 60/685,226 filed May 27, 2005.

BACKGROUND OF THE INVENTION

This invention relates to ROMs (Read-Only Memories). More specifically, this invention relates to the use of multiplexers within ROMs.

ROMs typically use multiplexers for implementing the required ROM functions such as basic reading, writing and addressing functions. The multiplexers that are used in ROMs are usually very large binary multiplexers. The very large binary multiplexers are relatively expensive in die area—i.e., they occupy relatively large areas of space on a typical die used in the implementation of semiconductor circuitry of the type used for programmable logic devices (PLDs).

The description herein relates directly to PLDs. Nevertheless, the scope of the description herein should not be considered to be limited to PLDs. Rather, the scope of the descriptions herein extends to any circuitry in which multiplexers are implemented.

Figure 1:
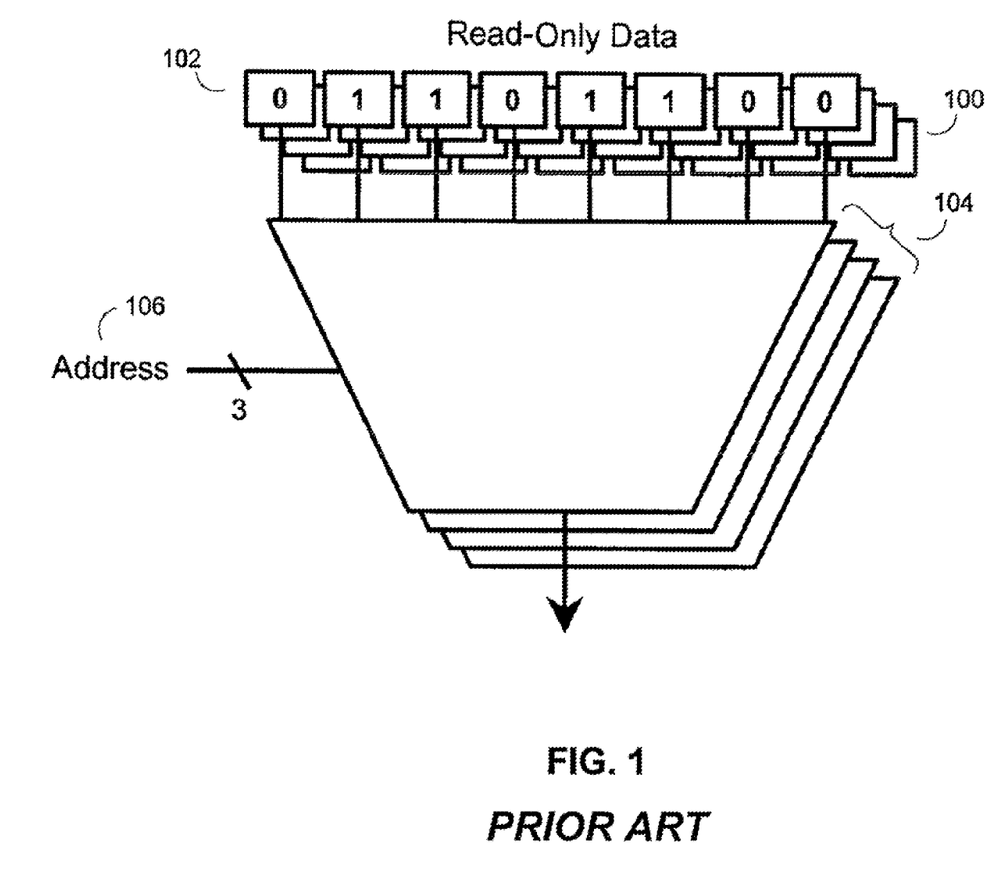
FIG. 1 shows a schematic diagram of a prior art group of multiplexers for use in a ROM or portions thereof.

FIG. 1 shows an example of a prior art ROM implementation 100. ROM 102 includes 8 addresses 102 of the Read-Only Data that provides 4-bit wide data. The 4-bit wide data is implemented as four 8:1 binary multiplexers 104. Address lines 106 may be used as control lines to dictate the output of multiplexer 104.

In order to implement ROMs using such conventional multiplexer arrangements, commonly-known synthesis tools convert each multiplexer into separate Look-up Tables (LUTs). The following table shows the relative area (as expressed in terms of the estimated number of LUTs that are required to implement the prior art ROM) used by such ROMs.

| Data Width | Number of Data Words | Area Estimate in 4-input LUTs |
| --- | --- | --- |
| 8 bits | 32 | 24 |
| 16 bits | 32 | 60 |
| 16 bits | 64 | 111 |
| 32 bits | 128 | 447 |

It can be seen from the foregoing table that the relative area cost depends on the size and type of ROM being implemented. The area estimates were calculated by synthesizing ROMs of the described sizes filled with randomly-generated data. Synthesis was performed using a proprietary software package of Altera Corporation of San Jose, Calif.

In view of the significant area cost associated with ROMs that use large multiplexers, it would be desirable to provide alternative synthesis systems and methods for implementing ROMs that use less multiplexers than conventional ROMs.

It would also be desirable to re-use multiplexers under certain conditions and in certain implementations of ROMs instead of converting each multiplexer into Look-up Tables separately.

SUMMARY OF THE INVENTION

It is an object of the invention to provide alternative synthesis systems and methods for implementing ROMs that use fewer multiplexers than conventional ROMs.

It is a further object of the invention to re-use multiplexers under certain conditions and in certain implementations of ROMs.

A method for reducing the die area occupied by an electronic circuit comprising a plurality of multiplexers is provided. In one embodiment of the invention, the method includes identifying two multiplexers in a design of the electronic circuit from the plurality of multiplexers. The two multiplexers preferably receive identical data inputs and are not used by the electronic circuit to provide outputs during the same clock cycle. Furthermore, the method includes modifying the design of the electronic circuit to merge the two multiplexers into a merged multiplexer.

BRIEF DESCRIPTION OF THE DRAWINGS

The above and other advantages of the invention will be more apparent upon consideration of the following detailed description, taken in conjunction with the accompanying drawings, in which like reference characters refer to like parts throughout, and in which.

DETAILED DESCRIPTION OF THE INVENTION

The basic concept underlying the invention is that, under certain conditions, the functions, and consequently, the die area for two separate multiplexers can be combined into a single multiplexer, thereby saving die area.

The following two conditions should preferably be met in order to combine two multiplexers in systems and methods according to the invention. Each of the multiplexers should preferably not be configured to be used substantially simultaneously—i.e., in same clock cycle. Second, each of the multiplexers should have the same data inputs but different control inputs. Under these constraints, two multiplexers can be replaced by a single multiplexer.

In ROM circuitry according to the invention, a single multiplexer replaces two multiplexers as follows: The new multiplexer is connected in place of both multiplexers. This is possible because both multiplexers use the same data inputs.

The control lines for each of the individual multiplexers may be different. Therefore, the control lines for each of the original multiplexers should preferably be accessible by the merged multiplexer according to the invention. When the functions associated with the first multiplexer are selected the control lines of the new multiplexer are fed by the set of control lines originally associated with the first multiplexer. When the functions associated with the second multiplexer are selected the control lines are preferably fed by the set of control lines originally associated with the second multiplexer.

This technique can preferably be applied to any kind of multiplexer. However, the largest area savings usually result from applying the technique to ROMs. One reason that ROMs are well-suited to take advantage of the benefits provided by the invention is that designs for ROMs frequently reuse the same Read-Only Data in different modules. Furthermore, a single ROM can use many hundreds of multiplexer-based LUTs. For at least the two preceding reasons ROMs can obtain particular advantage from the benefits according to the invention.

In order to identify which multiplexers in a particular design may be merged using techniques according to the invention, the following steps may be followed. First, it is possible to divide all multiplexers in a design into groups called multiplexer cones. The term multiplexer cones is defined herein to be a group of connected multiplexers, the outputs of all but one of which only feed data inputs of other multiplexers in the group. If two multiplexers which are part of the same multiplexer cone have individual data inputs, and have outputs that cannot be used simultaneously, then they satisfy the conditions required to be merged.

Multiplexers may be grouped into multiplexer cones using the following exemplary algorithm, according to the invention:

```
for all nodes, N, in the design do
    if N is a mux and N is not a member of any
        cone then
        C = create a new empty cone
        expand_cone(N, C)
    end if
end for
function expand_cone(N, C)
    insert node N into cone C
    for all nodes, I, feeding data inputs of N
        if I is a mux and all outputs of I feed
            muxes in C then
            expand_cone(T, C)
        end if
    end for
end function
```

Then, two (or more) multiplexers (preferably in the same cone) are replaced by a new, single multiplexer. The data inputs of the new multiplexer are preferably identical to the data inputs of the original multiplexer.

The next step in the technique is calculating the control lines of the new multiplexer. The new multiplexer preferably performs an identical function to either of the original multiplexers. However, as stated above, the original multiplexers have different control lines and perform, therefore, different logic functions. This contradiction can preferably only be resolved because each of the original multiplexers was never used at the same time as the other original multiplexer. Thus, at any given time, the new multiplexer uses whichever set of control lines correspond to the original multiplexer which would have been used at that time—i.e., during that clock cycle.

In order to generate new control logic according to the invention, a copy of the multiplexer cone is preferable created. The copy preferably replaces the original multiplexers and their control lines with a single multiplexer having additional logic which implements the control lines as needed. Any other primary data input—i.e., an input not used to replicate the original control logic—to the replicated cone is treated as a "don't care" value.

Furthermore, known optimization techniques may be used to collapse multiplexers fed by "don't care" inputs. In this way the additional logic required to coordinate the control logic can also be substantially reduced.

In summation, the algorithm according to the invention preferably is:

```
find all multiplexer cones
for each cone do
    loop
        try to find a pair of multiplexers in
            the cone with identical data
        if found a pair then
            replace the pair with a single
                multiplexer
        end if
    where found a pair
end for
```

It has been shown that certain systems and methods according to the invention obtain some advantages over the prior art. For example, the systems and methods according to the invention reduce required silicon area by reducing the number of large ROMs or multiplexers required to implement the design. Less silicon area is also required because the invention yields a large reduction in required logic elements. Finally, the additional logic required for the new control logic is typically just a few 2:1 multiplexers as shown in more detail in FIG. 5B and described in the text corresponding thereto.

It should be noted that in simulations performed in Altera Corporation's benchmark design sets, area reductions of up to 30% were obtained.

Heretofore, the basic principles of the invention have been set forth. FIGS. 2-6, and the associated written descriptions, show particular portions of the technique according to the invention.

Figure 2:
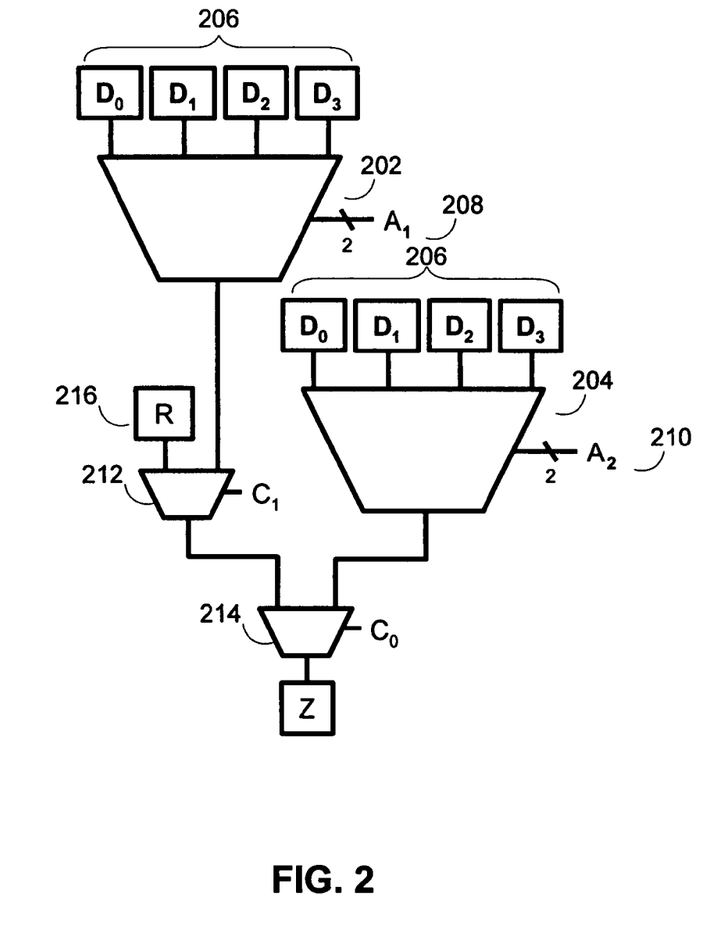
FIG. 2 shows a schematic diagram of a combination of multiplexers upon which systems and methods according to the invention can be implemented.

FIG. 2 shows a schematic diagram of a combination of multiplexers 202 and 204 upon which systems and methods according to the invention can be implemented. Data inputs 206 are identical for both multiplexer 202 and 204. Control lines 208 and 210, however, are different for each of multiplexers 202 and 204. Multiplexers 212 and 214 are used to select the appropriate output from the multiplexers 202 and 204. Multiplexers 212 and 214 are typically controlled by conditional operators, or other suitable operators, $C_0$ and $C_1$, which respond to signals from other portions of the circuit and, in response, select which output is appropriate. At times, for example, $C_1$ might select output R from input 216 to be selected in response to some preferably predetermined circuit condition.

Figure 3:
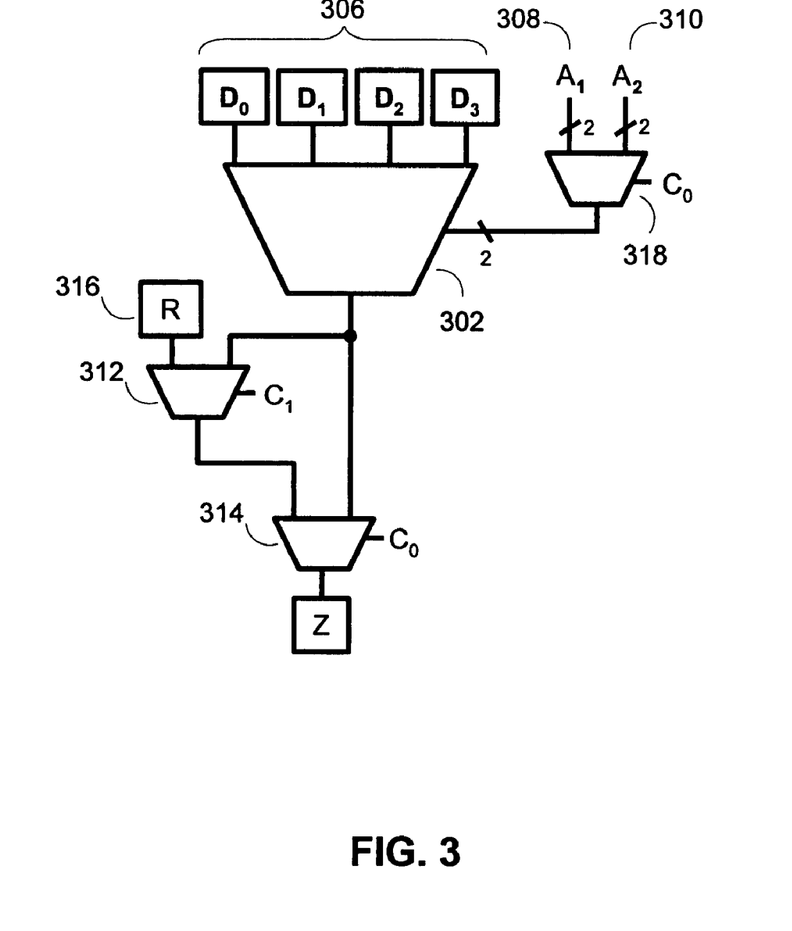
FIG. 3 shows a schematic diagram of the multiplexer circuitry implemented according to the invention.

FIG. 3 shows a schematic diagram of multiplexer circuitry according to the invention. One difference between the multiplexer circuitry shown in FIG. 3 and the multiplexers shown in FIG. 2 is that the two multiplexers 202 and 204 have been replaced by a single multiplexer 302. Another difference is that the two control lines 308 and 310 have been multiplexed using multiplexer 318. The output of multiplexer 318 provides the appropriate control signal for multiplexer 302 in response to the signal from conditional operator $C_0$. Preferably, the control lines of multiplexer 302 are fed by $A_1$ whenever multiplexer 202 would have been selected and by $A_2$ whenever multiplexer 204 would have been selected.

Figure 4A:
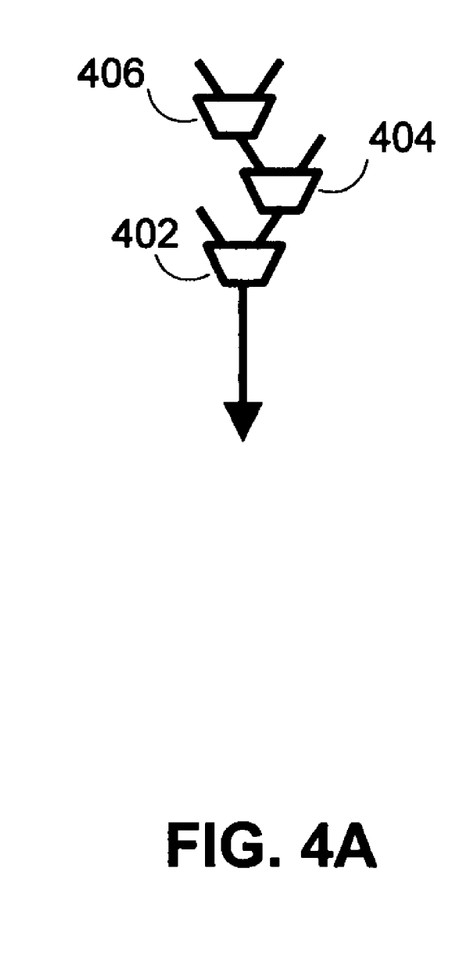
FIGS. 4A-C show schematic diagrams of examples of multiplexer cones according to the invention.
Figure 4B:
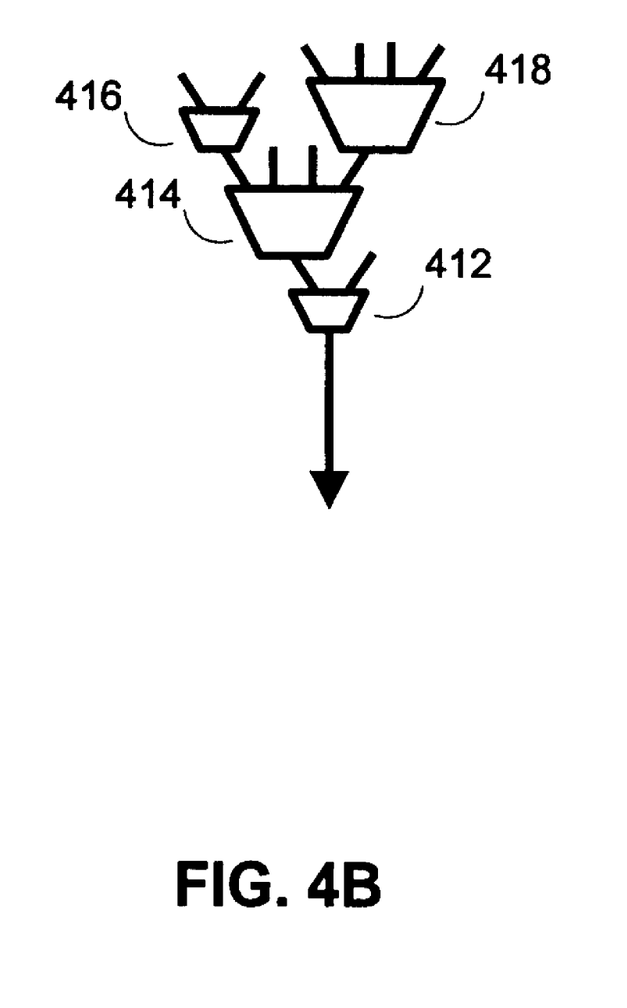
Figure 4C:
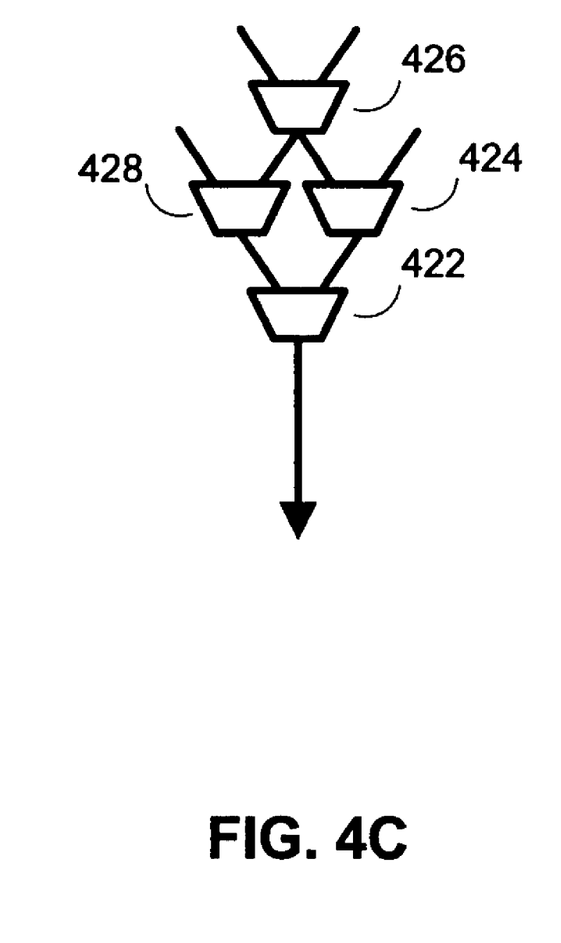

FIGS. 4A-C show examples of multiplexers that form multiplexer cones according to the invention. As defined above multiplexer cones preferably include a group of connected multiplexers. The outputs of preferably all but one of which only feed data inputs of other multiplexers in the group.

FIG. 4A shows one group where each of the multiplexers are two-input multiplexers 402, 404 and 406. Multiplexer 402 is the only multiplexer which has an output that does not feed an input of other multiplexers in the group. Preferably, any of the multiplexers could be merged with one another because they are all two-input multiplexers (when the other two conditions enumerated above are satisfied—i.e., they have the same inputs and they do not provide outputs in the same clock cycle).

FIG. 4B shows a multiplexer cone including multiplexers 412, 414, 416, and 418. At least multiplexers 414 and 418 as well as 412 and 416 can be combined, respectively (assuming, again, that the two conditions are met).

Finally, FIG. 4C shows a multiplexer cone which is similar to the cone shown in FIG. 4A. The only difference is the addition of multiplexer 428 to the other three multiplexers.

Figure 5A:
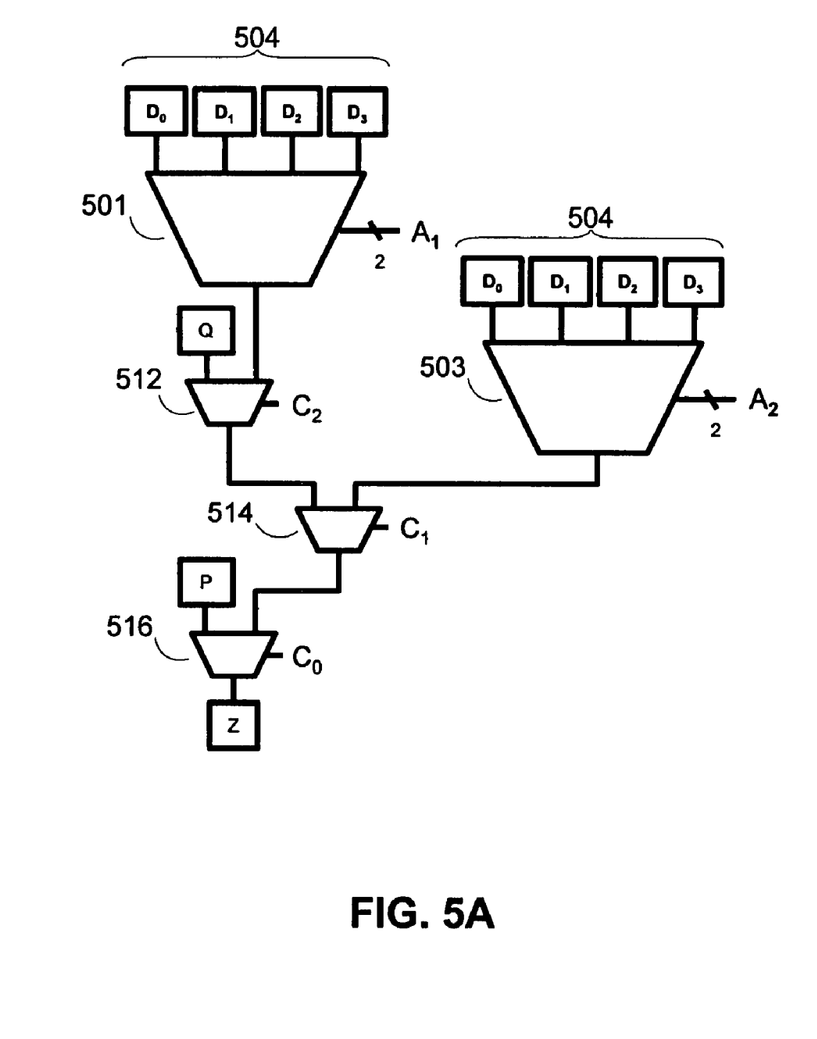
FIGS. 5A-B show a set of schematic diagrams which illustrate a first system and method of generating new control logic according to the invention.
Figure 5B:
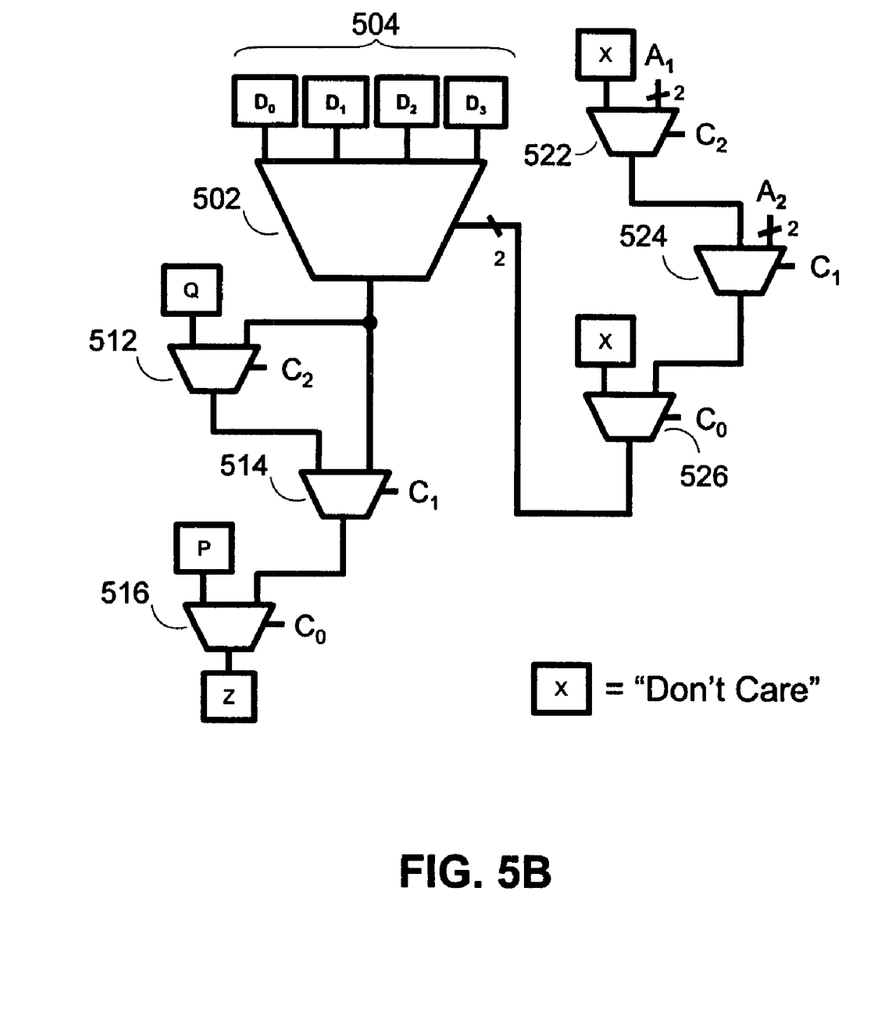

FIG. 5A and FIG. 5B illustrate the technique according to the invention of generating new control logic. It can be seen that all the elements shown in FIGS. 5A and 5B are essentially the same as elements shown in FIG. 3 with the exception of elements 516 in FIGS. 5A and 5B and elements 522, 524 and 526 in FIG. 5B. Multiplexer 516 is additional logic which is fed by a control line from a suitable conditional operator from the rest of the circuitry. Multiplexers 522, 524 and 526 each provide logic for the appropriate control logic to merged multiplexer 502. It should be noted that Xs symbolize "don't care" logic. It should also be noted that multiplexers 522, 524 and 526 may be merged according to known optimization techniques to collapse multiplexers fed by "don't cares" to form a control circuit that is shown as multiplexer 318 in FIG. 3.

Thus, a technique for merging multiplexer-based ROMs and other multiplexer-based circuitry has been provided.

Figure 6:
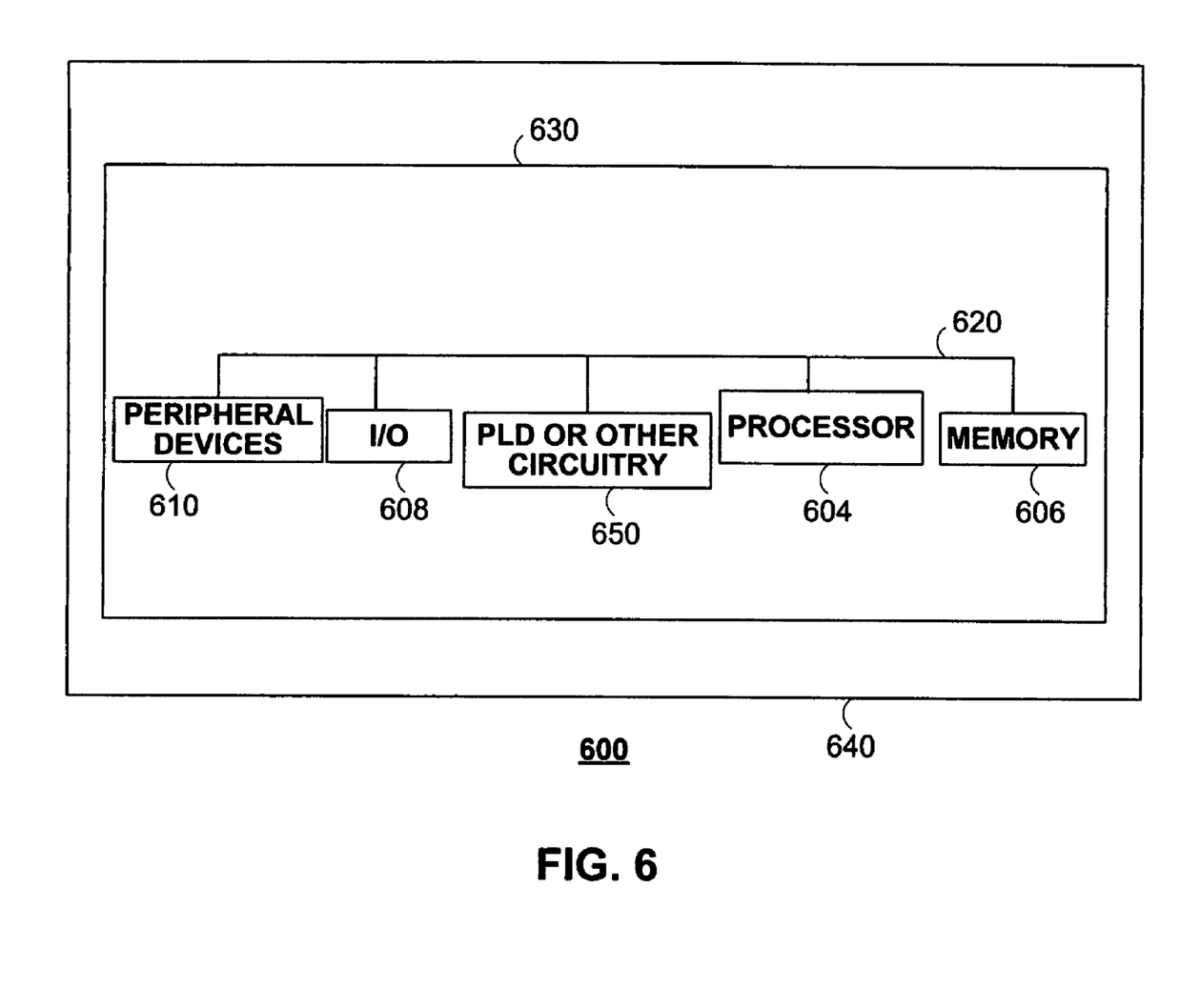
FIG. 6 is a simplified block diagram of an illustrative system employing circuitry in accordance with the invention.

FIG. 6 illustrates a PLD or other circuitry in a data processing system 600 that may incorporate a merged multiplexer in accordance with the invention. Data processing system 600 may include one or more of the following components: a processor 604; memory 606; I/O circuitry 608; and peripheral devices 610. These components are coupled together by a system bus or other interconnections 620 and are populated on a circuit board 630 (e.g., a printed circuit board), which is contained in an end-user system 640. Any of the interconnections between element 650 and any other elements may be made in a manner known to one skilled in the art.

System 600 can be used in a wide variety of applications, such as computer networking, data networking, instrumentation, video processing, digital signal processing, or any other application where the advantage of using programmable or reprogrammable logic is desirable. Circuitry 650 can be used to perform a variety of different logic functions. For example, circuitry 650 can be configured as a processor or controller that works in cooperation with processor 604. Circuitry 650 may also be used as an arbiter for arbitrating access to a shared resource in system 600. In yet another example, circuitry 650 can be configured as an interface between processor 604 and one of the other components in system 600. It should be noted that system 600 is only exemplary, and that the true scope and spirit of the invention should be indicated by the following claims.

It will be understood, therefore, that the foregoing is only illustrative of the principles of the invention, and that various modifications can be made by those skilled in the art without departing from the scope and spirit of the invention, and the present invention is limited only by the claims that follow.

What is claimed is:

1. A method for reducing the die area occupied by an electronic circuit comprising a plurality of multiplexers, the method comprising:
   identifying, in a design of the electronic circuit, two multiplexers from the plurality of multiplexers, wherein the two multiplexers receive identical data inputs and are not both used by the electronic circuit to provide outputs during any single clock cycle, and wherein each respective one of the two multiplexers is fed by a respective control line;
   modifying the design of the electronic circuit to merge the two multiplexers into a merged multiplexer;
   feeding each of the respective control lines of the two multiplexers into data inputs of a control multiplexer; and
   using output of the control multiplexer as a control line for the merged multiplexer.

2. The method of claim 1 further comprising:
   identifying a plurality of multiplexers that form a multiplexer cone; wherein:
      the identifying the two multiplexers comprises identifying the two multiplexers from among the plurality of multiplexers that form the multiplexer cone.

3. The method of claim 2, wherein the multiplexer cone is characterized as a plurality of multiplexers the outputs of all but one of which only feed data inputs of other multiplexers in the cone.

4. A method for reducing the die area occupied by a programmable logic device, the device comprising a plurality of multiplexers, a portion of the multiplexers forming a multiplexer cone, all but one of the multiplexers in the cone having outputs which only feed data inputs of other multiplexers in the cone, the method comprising:
   identifying two multiplexers in the cone, wherein the two multiplexers receive substantially identical data inputs and are not both used by the electronic circuit to provide outputs during any single clock cycle, and wherein each respective one of the two multiplexers is fed by a respective control line;
   merging the functions of the two multiplexers into a single multiplexer;
   feeding each of the respective control lines into data inputs of a control multiplexer; and
   using output of the control multiplexer as a control line for the merged multiplexer.

5. A programmable logic device comprising:
   a merged multiplexer capable of performing the functions of two independent multiplexers, the two independent multiplexers receiving identical data inputs and not both being used by the programmable logic device to provide outputs during any single clock cycle,
   each respective one of the multiplexers being fed by a respective control line, wherein:
   each of the respective control lines is fed into a data input of a control multiplexer; and
   output of the control multiplexer is used as a control line for the merged multiplexer.

6. The device of claim 5 further comprising:
   a plurality of multiplexers that form a multiplexer cone; wherein:
   the two independent multiplexers being are selected from among the plurality of multiplexers that form the multiplexer cone.

7. The device of claim 6, wherein the multiplexer cone is characterized as a plurality of multiplexers the outputs of all but one of which only feed data inputs of other multiplexers in the cone.

8. A printed circuit board on which is mounted a programmable logic device as defined in claim 5.

9. The printed circuit board defined in claim 8 further comprising:

memory circuitry mounted on the printed circuit board and coupled to the programmable logic device.

10. The printed circuit board defined in claim 9 further comprising:

processing circuitry mounted on the printed circuit board and coupled to the memory circuitry.

* * * * *